United States Patent
Mueller

(10) Patent No.: US 7,339,245 B2
(45) Date of Patent: Mar. 4, 2008

(54) HALL SENSOR

(75) Inventor: Thomas Mueller, Graz (AT)

(73) Assignee: Austriamicrosystems AG (AT)

(*) Notice: Subject to any disclaimer, the term of this patent is extended or adjusted under 35 U.S.C. 154(b) by 136 days.

(21) Appl. No.: 10/526,137

(22) PCT Filed: Aug. 14, 2003

(86) PCT No.: PCT/EP03/09043

§ 371 (c)(1),
(2), (4) Date: Nov. 2, 2005

(87) PCT Pub. No.: WO2004/025743

PCT Pub. Date: Mar. 25, 2004

(65) Prior Publication Data

US 2006/0108654 A1  May 25, 2006

(30) Foreign Application Priority Data

Sep. 2, 2002 (DE) .................... 102 40 404

(51) Int. Cl.
*H01L 27/14* (2006.01)
*H01L 29/82* (2006.01)
*H01L 29/84* (2006.01)
*H01L 23/552* (2006.01)
*H01L 29/34* (2006.01)

(52) U.S. Cl. .......... 257/421; 257/108; 257/414; 257/422; 257/423; 257/424; 257/425; 257/426; 257/427; 257/659

(58) Field of Classification Search ........... 257/414, 257/421–427, 108, 659
See application file for complete search history.

(56) References Cited

U.S. PATENT DOCUMENTS

| | | | | |
|---|---|---|---|---|
| 3,825,777 A | | 7/1974 | Braun | 327/511 |
| 4,010,486 A | * | 3/1977 | Suzuki | 257/423 |
| 4,253,107 A | * | 2/1981 | Macdougall | 257/427 |
| 4,607,271 A | * | 8/1986 | Popovic et al. | 257/422 |
| 4,634,961 A | * | 1/1987 | Popovic et al. | 323/368 |
| 4,673,964 A | * | 6/1987 | Popovic et al. | 257/427 |
| 4,929,933 A | * | 5/1990 | McBeath et al. | 345/22 |
| 4,929,993 A | | 5/1990 | Popovic | 257/424 |
| 5,548,151 A | * | 8/1996 | Funaki et al. | 257/421 |

(Continued)

FOREIGN PATENT DOCUMENTS

CH            663 686        12/1987

(Continued)

OTHER PUBLICATIONS

Translation of International Preliminary Examination Report for Application No. PCT/EP2003/009043.

(Continued)

*Primary Examiner*—Ida M. Soward
(74) *Attorney, Agent, or Firm*—Fish & Richardson P.C.

(57) ABSTRACT

A Hall sensor on a semiconductor substrate includes a Hall plate in the semiconductor substrate, where the Hall plate includes a first zone having a first conduction type. The semiconductor substrate also include a second zone having a second conduction type. A space-charge zone in the semiconductor substrate separates the first zone and the second zone, first contacts supply a control current to the first zone, and second contacts supply a compensation current to the second zone.

20 Claims, 3 Drawing Sheets

U.S. PATENT DOCUMENTS

| | | | | |
|---|---|---|---|---|
| 5,572,058 | A | * | 11/1996 | Biard .................... 257/421 |
| 5,652,445 | A | * | 7/1997 | Johnson .................. 257/295 |
| 5,679,973 | A | | 10/1997 | Mochizuki et al. ......... 257/421 |
| 5,733,791 | A | * | 3/1998 | Iranmanesh .............. 438/309 |
| 6,278,271 | B1 | * | 8/2001 | Schott .................... 324/251 |
| 2002/0186584 | A1 | * | 12/2002 | McDowell et al. ......... 365/171 |

FOREIGN PATENT DOCUMENTS

| | | |
|---|---|---|
| DE | 43 08 375 | 9/1994 |
| EP | 0 162 214 | 3/1985 |
| EP | 0 204 135 | 4/1986 |
| EP | 0 735 600 | 10/1996 |

OTHER PUBLICATIONS

Mani, R.G. et al "Temperature-insensitive Offset Reduction in a Hall Effect Device" Applied Physics Letter, vol. 64, No. 23, Jun. 1994 pp. 3121-3123, XP000449593.

P.J.A. Munter "A Low Offset Spinning-current Hall Plate" Sensors & Actuators A, A22 (1990), pp. 743-746.

* cited by examiner

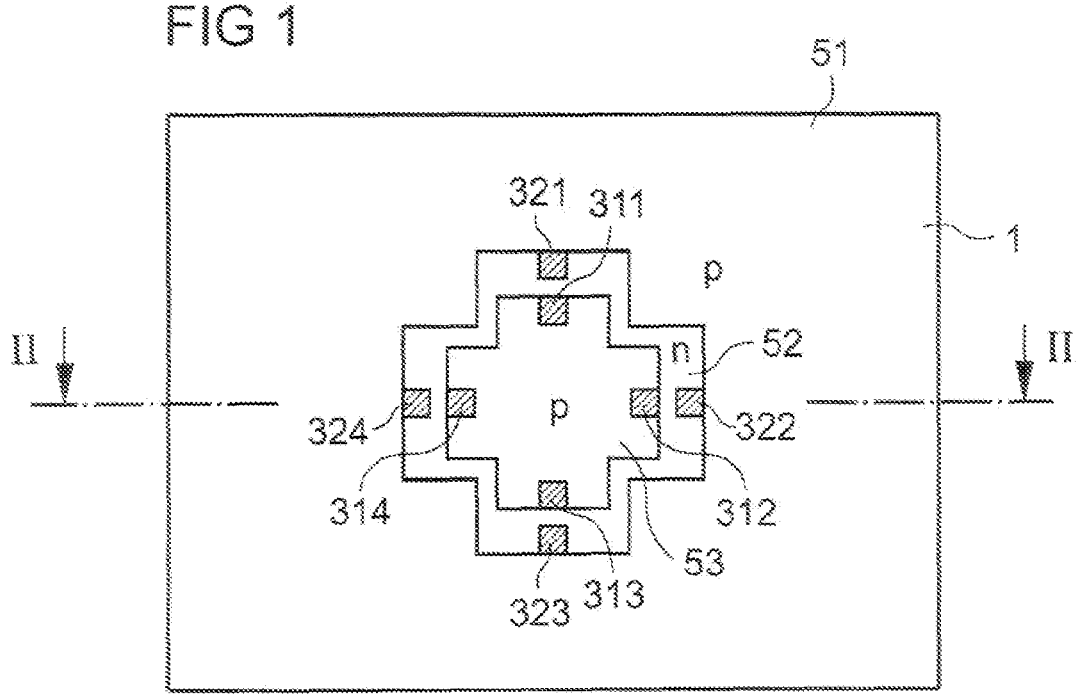

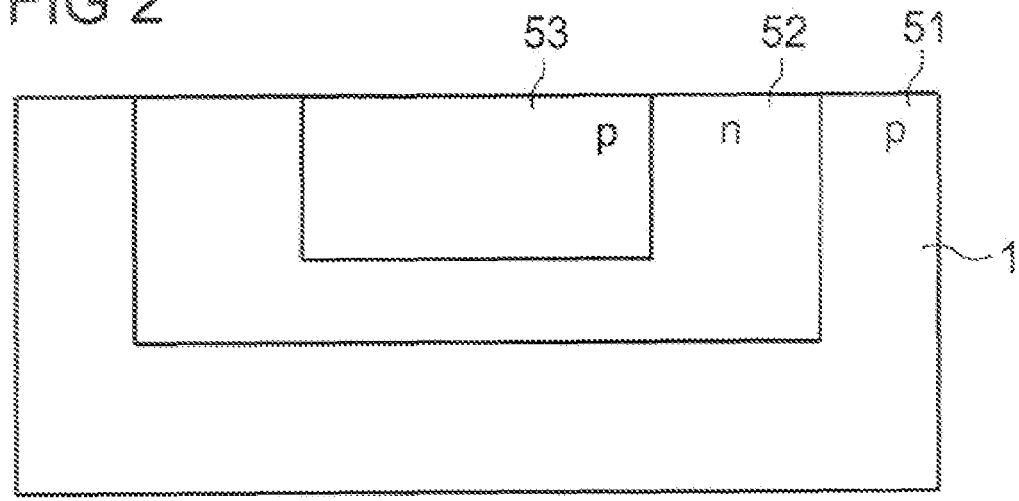
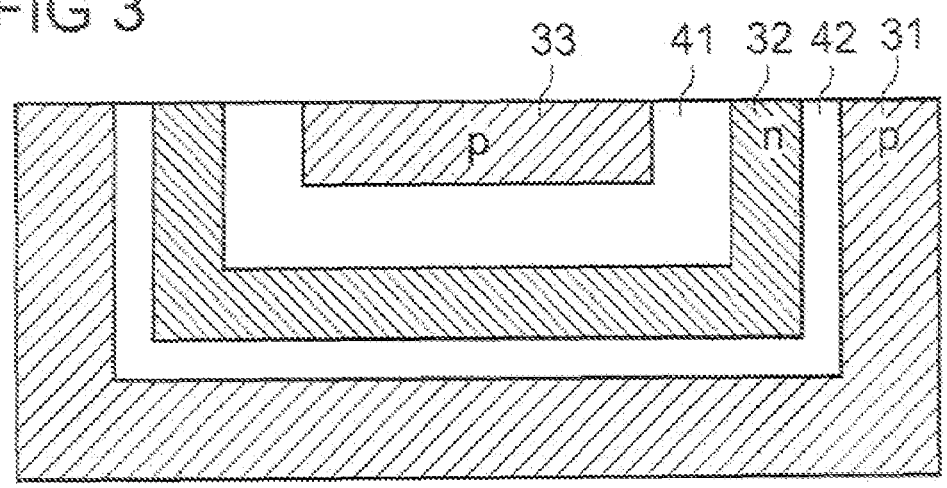

HALL SENSOR

TECHNICAL FIELD

The invention relates to a Hall sensor on a semiconductor substrate as well as to an operating method for the Hall sensor.

From the printed publication U.S. Pat. No. 4,929,993, Hall sensors on a silicon substrate are known in which an n-doped zone has been placed in a p-doped trough. In this arrangement the n-doped zone forms the active zone of the Hall sensor, i.e. the Hall plate. The Hall plate comprises four external connections, wherein in each instance opposite connections are provided for feeding in the control current and for reading out the Hall voltage respectively.

Known Hall sensors are associated with a disadvantage in that they are not particularly suited to the measuring of very small static magnetic fields because even if a magnetic field=0, due to material inhomogeneities, Hall sensors generate a Hall voltage in the form of an offset voltage.

In order to reduce offset voltages, from printed publication P. J. A. Munter, A low Offset spinning-current hall plate, Sensors & Actuators A, A22 (1990) 743-746, the operation of Hall sensors with a special operating method is known. To this effect a control current which over time rotates on the axis of the magnetic field is applied to the Hall plate. Since during rotation of the direction of current by 90 degrees the offset voltage changes its sign, by way of adding offset voltage pairs measured with a rotation of 90 degrees the overall offset voltage can be compensated for, except for a residual offset voltage.

BACKGROUND

In a Hall plate comprising an n- or p-doped zone, embedded in a semiconductor substrate of the respective other conduction type, the size of the residual offset voltage is influenced by an effect which is described below. A space-charge zone between the Hall plate and its surroundings is created. If a control current is impressed on the Hall plate, a voltage drop results over one direction of the Hall plate, which voltage drop changes the width of the space-charge zone and consequently the width of the Hall plate, i.e. in the end the active zone in the semiconductor material in which the Hall effect takes place.

SUMMARY

It is thus the object of the present invention to state a Hall sensor which can be operated such that the residual offset voltage is reduced.

This object is met by a Hall sensor according to claim 1 and by a method according to claim 4 for operating said Hall sensor. Advantageous embodiments of the invention are provided in the further dependent claims.

A Hall sensor is stated which is arranged on a semiconductor substrate. A Hall plate is formed from a zone of one conduction type in the substrate. A zone of the other conduction type adjoins the Hall plate. The zone of the other conduction type and the Hall plate are separated from each other only by a space-charge zone. The Hall plate comprises contacts which are suited to the supply of a control current. Furthermore, the zone of the other conduction type comprises contacts for supplying a compensation voltage.

The Hall element provides an advantage in that by providing the option of feeding a compensation current into a region adjacent to the space-charge zone the thickness of the space-charge zone and consequently the thickness of the Hall plate can be positively influenced. Accordingly, a method for operating the Hall sensor is stated, wherein a compensation current flows parallel to the control current whose magnitude is such that the thickness of the Hall plate is essentially constant.

In a first embodiment of the Hall element, the Hall plate is arranged between two zones of the other conduction type. This embodiment provides the advantage of making it possible to influence the thickness of the Hall plate from both sides by means of compensation current.

In another embodiment, the Hall plate is arranged on the surface of the substrate. Furthermore, the zone of the other conduction type is embedded in a substrate of the same conduction type as the Hall plate. In this special design variant, too, compensation of the deformation of the Hall plate due to the voltage drop is achieved by supplying a control current.

Below, the invention is explained in more detail by means of exemplary embodiments and the associated figures:

DESCRIPTION OF THE DRAWINGS

FIG. 1 shows a top view of a Hall sensor of a first and a second embodiment;

FIG. 2 shows a cross section, along the line II-II in FIG. 1, of a Hall sensor for a first and second embodiment;

FIG. 3 shows a cross section corresponding to that of FIG. 2;

DETAILED DESCRIPTION

Figure 4:
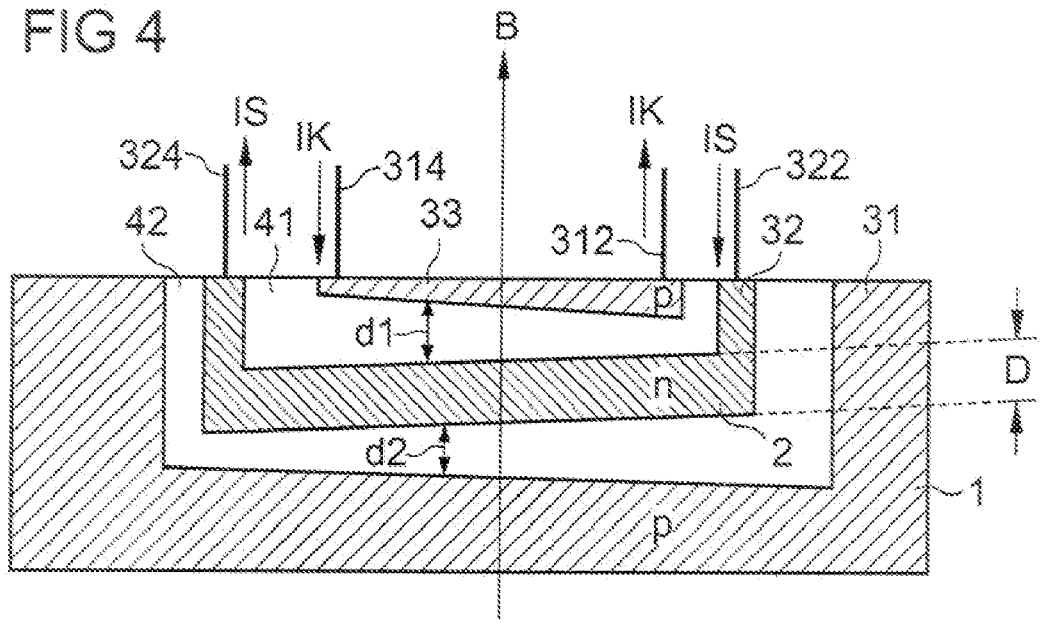
FIG. 4 shows a diagrammatic cross section of a first embodiment of a Hall sensor.

FIG. 1 shows a top view of a substrate 1. The substrate 1 can for example comprise silicon. The substrate 1 forms an outer p-doped zone 51. In a middle region of the substrate 1, an n-doped zone 52 is formed by doping. The zone 52 is in the shape of a cross with four contacts 321, 322, 323, 324 each on the outer ends of the cross. However, the zone 52 can also be in the shape of a square, rectangle or circle. In the interior of the zone 52 a p-doped zone 53 is formed as a result of p-doping. The zone 53 is similar to the zone 52, and the outer edges of the zone 53 are parallel to corresponding outer edges of the zone 52. On the lateral edges of zone 53, which edges correspond to those of zone 52, contacts 311, 312, 313, 314 are arranged. The contacts 311, 312, 313, 314, 321, 322, 323, 324 are used for feeding currents into the individual zones 51, 52, 53, i.e. for acquiring a Hall voltage.

FIG. 2 shows a cross section of FIG. 1 along the line II-II. In particular the depth structures of the zones 51, 52, 53 are shown. The zone 51 is a p-doped zone which is formed by the substrate 1. The n-doped zone 52 is embedded in substrate 1 by n-doping. The p-doped zone 53 is embedded in zone 52 by p-doping.

According to FIG. 3, in the locations without a space-charge zone, the conducting zones 31, 32, 33, which comprise the doped zones 51, 52, 53 according to FIG. 2, remain. In each instance, a space-charge zone 41, 42 is formed between two zones 51, 52; 52, 53 of opposite doping. In FIG. 3 the space-charge zones 41, 42 are shown by non-hatched areas. In those positions where the compensation of p-conducting and n-conducting charge carriers is stopped, electrically conducting zones 31, 32, 33 remain. These are in particular the p-conducting zone 31 which corresponds to the p-doped zone 51, and the p-conducting zone 33 in the middle of FIG. 3, which zone corresponds to the p-doped zone 53. Each of the p-conducting zones is marked by hatched areas of the same type. Corresponding to the n-doped zone 52, the n-conducting zone 32 forms, which is marked by hatching that extends in the direction opposite to that of the p-conducting zones 31, 33.

FIG. 4 shows a Hall sensor according to FIG. 3, wherein the n-conducting zone 32 is used as a Hall plate 2. Correspondingly, a control current IS is fed into zone 32 by way of the contacts 322, 324, wherein only one direction of the control current is discussed in this document. The control current IS causes a voltage drop along the zone 32, which voltage drop results in a corresponding variation in the thickness d2 of the space-charge zone 42. The current direction shown in FIG. 4 causes the space-charge zone to be thicker towards the right end than towards the left end. Correspondingly, the form of zone 32 is influenced. This influencing of the zone 32 can now be compensated for in that a compensation current IK flows in the p-conducting zone 33. The compensation current IK is fed into zone 33, which is p-conducting, by way of the contacts 312, 314. The compensation current IK extends parallel to the control current IS. The compensation current IK in turn influences the thickness of the space-charge zone 41 between the zone 33 and the Hall plate 2. The compensation current IK causes the space-charge zone 41 to be thicker towards the left end than towards the right end. In other words, the thickness gradient of the space-charge zones 41, 42 is the exact opposite. As a result, with a suitable selection of the current IK, this allows the thickness D of the zone 32, i.e. the thickness D of the Hall plate 2, to be kept essentially constant along its entire length so that the residual offset voltage can be reduced in a particularly advantageous way.

FIG. 4 diagrammatically shows the direction of the magnetic field B to be measured.

Figure 5:
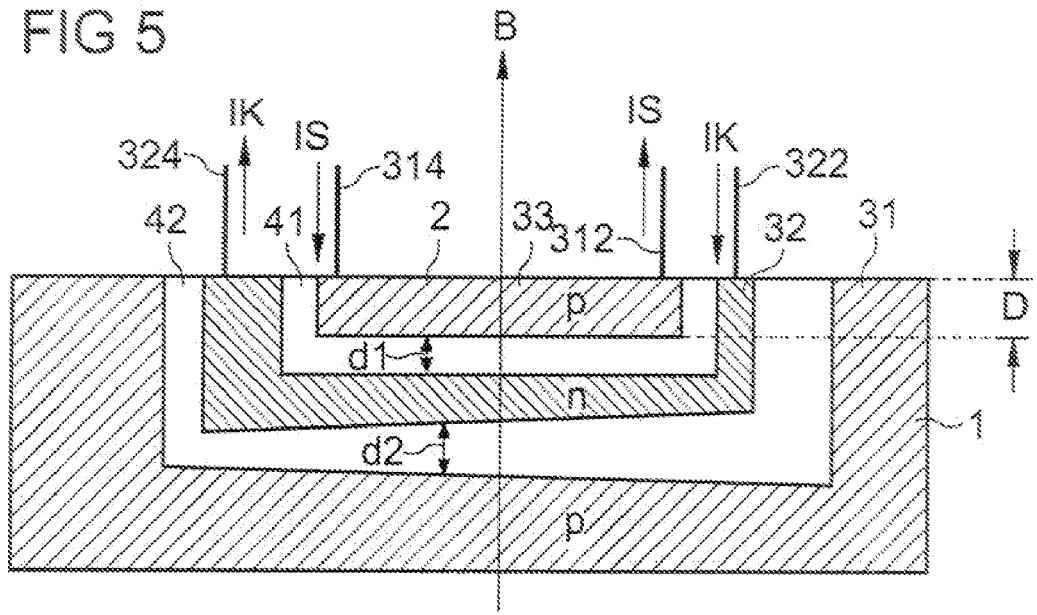
FIG. 5 shows a diagrammatic cross section of a further embodiment of a Hall sensor.

FIG. 5 shows a Hall sensor according to FIG. 4, except that it is not zone 32 that is used as a Hall plate 2, but instead zone 33 which is p-doped. Correspondingly, a control current IS is fed into zone 33 by way of contacts 312, 314. A compensation current IK is now applied by way of the contacts 322, 324 to the n-conducting zone 32, which is situated below zone 33. As already shown in FIG. 4, the compensation current IK extends parallel to the control current IS. The voltage between zone 32 and zone 33 is almost identical at any location, which is why the thickness d1 of the space-charge zone 41 is almost constant. The thickness d1 is proportional to the root of the voltage between zone 32 and zone 33.

As a result of the above, the thickness of zone 33, represented by the Hall plate 2, is also essentially constant along its length so that here too a positive influence on the offset voltage results. FIG. 5 also shows the influence of the compensation current IK on the thickness d2 of the space-charge zone 42 between zone 32 and zone 31 along the length of said space-charge zone. However, the variation in thickness d2 of the space-charge zone 42 does not have any significant influence on the Hall plate 2.

The doping used in the examples described can for example be between $1\times10^{14}$ cm$^{-3}$ and $1\times10^{18}$ cm$^{-3}$; typically it is $5\times10^{16}$ cm$^{-3}$. The currents used can for example be between 0.1 and 10 mA; typically they are 1 mA.

The following invention is not limited to Hall sensors in silicon substrates, but instead it can be applied to all suitable semiconductor materials.

What is claimed is:

1. A Hall sensor on a semiconductor substrate, the Hall sensor comprising:
   a Hall plate in the semiconductor substrate, the Hall plate comprising a first zone having a first conduction type;
   a second zone in the semiconductor substrate, the second zone having a second conduction type;
   a space-charge zone in the semiconductor substrate, the space-charge zone separating the first zone and the second zone;
   first contacts for supplying a control current to the first zone; and
   second contacts for supplying a compensation current to the second zone.

2. The Hall Sensor of claim 1, further comprising a third zone of the second conduction type outside of the first zone relative to the second zone.

3. The Hall sensor of claim 1, wherein the semiconductor substrate has the second conduction type.

4. The Hall sensor of claim 1, wherein the compensation current flows parallel to the control current; and
   wherein a thickness of the Hall plate is substantially constant.

5. The apparatus of claim 1, wherein the first zone has an area that is one of cross-shaped, rectangular, square and circular.

6. The apparatus of claim 1, wherein the second zone has an area that is one of cross-shaped, rectangular, square and circular.

7. The apparatus of claim 1, wherein the first zone is N-doped and the second zone is P-doped.

8. An apparatus comprising:
   a first zone having a first doping, the first zone carrying a compensation current;
   a second zone having a second doping, the second zone carrying a control current;
   a third zone having the first doping;
   a first separation zone that separates the first and second zones, the compensation current affecting a thickness of the first separation zone; and
   a second separation zone that separates the second and third zones, the control current affecting a thickness of the second separation zone.

9. The apparatus of claim 8, wherein the compensation current and the control current affect thickness of the first and second separation zones to maintain a substantially constant thickness of the second zone.

10. The apparatus of claim 8, wherein the first zone has an area that is one of cross-shaped, rectangular, square and circular.

11. The apparatus of claim 8, wherein the second zone has an area that is one of cross-shaped, rectangular, square and circular.

12. The apparatus of claim 8, wherein the first and third zones are P-doped and the second zone is N-doped.

13. The apparatus of claim 8, wherein the first and second separation zones comprise space-charged zones that are not doped.

14. The apparatus of claim 8, wherein the first zone comprises contacts for receiving the compensation current; and
   wherein the second zone comprises contacts for receiving the control current.

15. An apparatus comprising:
   a first zone having a first doping, the first zone carrying a control current;

a second zone having a second doping, the second zone carrying a compensation current; and a separation zone that separates the first and second zones, the control current and the compensation current keeping a thickness of the first zone and a thickness of the separation zone substantially constant.

16. The apparatus of claim 15, wherein the first zone has an area that is one of cross-shaped, rectangular, square and circular.

17. The apparatus of claim 15, wherein the second zone has an area that is one of cross-shaped, rectangular, square and circular.

18. The apparatus of claim 15, wherein the first zone is P-doped and the second zone is N-doped.

19. The apparatus of claim 15, wherein the separation zone comprises a space-charged zone that is not doped.

20. The apparatus of claim 15, wherein the first and second zones comprise contacts for receiving current.

* * * * *